US007285018B2

(12) United States Patent
Kenny et al.

(10) Patent No.: US 7,285,018 B2
(45) Date of Patent: Oct. 23, 2007

(54) ELECTRICAL CONNECTOR INCORPORATING PASSIVE CIRCUIT ELEMENTS

(75) Inventors: William A. Kenny, Amherst, NH (US); Thomas S. Cohen, New Boston, NH (US); Robert A. Richard, New Boston, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 10/874,837

(22) Filed: Jun. 23, 2004

(65) Prior Publication Data

US 2005/0287869 A1 Dec. 29, 2005

(51) Int. Cl.
*H01R 13/66* (2006.01)

(52) U.S. Cl. .................................. 439/620.01

(58) Field of Classification Search ............... 439/620, 439/941, 608, 79, 108, 607, 701, 590; 333/182, 333/183
See application file for complete search history.

(56) References Cited

U.S. PATENT DOCUMENTS

| 3,115,379 | A | * | 12/1963 | McKee ........................ 439/290 |
| 3,978,375 | A |   | 8/1976  | Fukui et al. |
| 4,878,155 | A | * | 10/1989 | Conley ........................ 361/761 |
| 4,965,933 | A |   | 10/1990 | Mraz et al. |
| 5,163,540 | A | * | 11/1992 | Mainquist et al. ............ 192/3.3 |
| 5,287,076 | A | * | 2/1994  | Johnescu et al. ........... 333/182 |
| 5,340,334 | A | * | 8/1994  | Nguyen ........................ 439/620 |
| 5,702,258 | A | * | 12/1997 | Provencher et al. ........... 439/79 |
| 5,924,899 | A | * | 7/1999  | Paagman ....................... 439/701 |
| 5,941,447 | A | * | 8/1999  | Chu et al. ............... 228/180.21 |
| 5,980,321 | A |   | 11/1999 | Cohen et al. |
| 6,152,742 | A |   | 11/2000 | Cohen et al. .................. 439/60 |
| 6,168,469 | B1| * | 1/2001  | Lu .............................. 439/608 |
| 6,375,510 | B2| * | 4/2002  | Asao ........................... 439/620 |
| 6,379,188 | B1|   | 4/2002  | Cohen et al. |
| 6,409,543 | B1|   | 6/2002  | Astbury, Jr. et al. |
| 6,592,382 | B2| * | 7/2003  | Wurster ........................ 439/82 |
| 6,623,280 | B2| * | 9/2003  | Oldenburg et al. ............ 439/75 |
| 6,652,318 | B1| * | 11/2003 | Winings et al. .............. 439/608 |
| 6,932,649 | B1| * | 8/2005  | Rothermel et al. ..... 439/620.01 |
| 2002/0098738 | A1 |   | 7/2002  | Astbury, Jr. et al. |
| 2003/0203683 | A1 | * | 10/2003 | Iwasaki ........................ 439/894 |
| 2004/0110421 | A1 |   | 6/2004  | Broman et al. |
| 2005/0032430 | A1 | * | 2/2005  | Otsu et al. .................... 439/608 |
| 2005/0121224 | A1 | * | 6/2005  | Lien ............................ 174/250 |

* cited by examiner

*Primary Examiner*—Tulsidas C. Patel
*Assistant Examiner*—Phuongchi Nguyen
(74) *Attorney, Agent, or Firm*—Blank Rome LLP

(57) ABSTRACT

An electrical connector that electrically connects a first printed circuit board and a second printed circuit board is disclosed, where the electrical connector in the preferred embodiment includes: (a) an insulative housing; (b) a plurality of signal conductors, with at least a portion of each of the plurality of signal conductors disposed within the insulative housing; (c) each of the plurality of signal conductors having a first contact end, a second contact end and an intermediate portion therebetween; and (d) a passive circuit element electrically connected to the intermediate portion of each of the plurality of signal conductors, where the passive circuit element is housed in an insulative package and includes at least a capacitor or an inductor.

20 Claims, 6 Drawing Sheets

ELECTRICAL CONNECTOR INCORPORATING PASSIVE CIRCUIT ELEMENTS

BACKGROUND OF THE INVENTION

This invention relates generally to an electrical connector incorporating passive circuit elements and methods of manufacturing such an electrical connector.

Modern electronic circuitry is often built on printed circuit boards. The printed circuit boards are then interconnected to create an electronic system, such as a server or a router for a communications network. Electrical connectors are generally used to make these interconnections between the printed circuit boards. Typically, connectors are made of two pieces, with one piece on one printed circuit board and the other piece on another printed circuit board. The two pieces of the connector assembly mate to provide signal paths between the printed circuit boards.

A desirable electrical connector should generally have a combination of several properties. For example, it should provide signal paths with appropriate electrical properties such that the signals are not unduly distorted as they move between the printed circuit boards. In addition, the connector should ensure that the two pieces mate easily and reliably. Furthermore, the connector should be rugged so that it is not easily damaged by handling of the printed circuit boards. For many applications, it is also important that the connector have high density, meaning that the connector can carry a large number of electrical signals per unit length.

Examples of electrical connectors possessing these desirable properties include VHDM®, VHDM®-HSD and GbX® connectors manufactured and sold by the assignee of the present invention, Teradyne, Inc.

One of the disadvantages of present electronic systems is the need, often times, to populate the surfaces of the interconnected printed circuit boards with passive circuit elements. These passive circuit elements, such as capacitors, inductors and resistors, are necessary, for example: (i) to block or at least reduce the flow of direct current ("DC") caused by potential differences between various electronic components on the interconnected printed circuit boards; (ii) to provide desired filtering characteristics; and/or (iii) to reduce data transmission losses. However, these passive circuit elements take up precious space on the board surface (thus reducing the space available for signal paths). In addition, where these passive circuit elements on the board surface are connected to conductive vias, there could be undesirable signal reflections at certain frequencies due to impedance discontinuity and resonant stub effects.

What is desired, therefore, is an electrical connector and methods of manufacturing such an electrical connector that generally possesses the desirable properties of the existing connectors described above, but also provides passive circuit elements in the connector to deliver the desired qualities provided by the passive circuit elements described above. And it is further desired that such an electrical connector provide the passive circuit elements cost effectively.

SUMMARY OF THE INVENTION

The objects of the invention are achieved in the preferred embodiment by an electrical connector that electrically connects a first printed circuit board and a second printed circuit board, where the electrical connector includes: (a) an insulative housing; (b) a plurality of signal conductors, with at least a portion of each of the plurality of signal conductors disposed within the insulative housing; (c) each of the plurality of signal conductors having a first contact end, a second contact end and an intermediate portion therebetween; and (d) a passive circuit element electrically connected to the intermediate portion of each of the plurality of signal conductors, where the passive circuit element is housed in an insulative package and includes at least a capacitor or an inductor.

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENT

Figure 1:
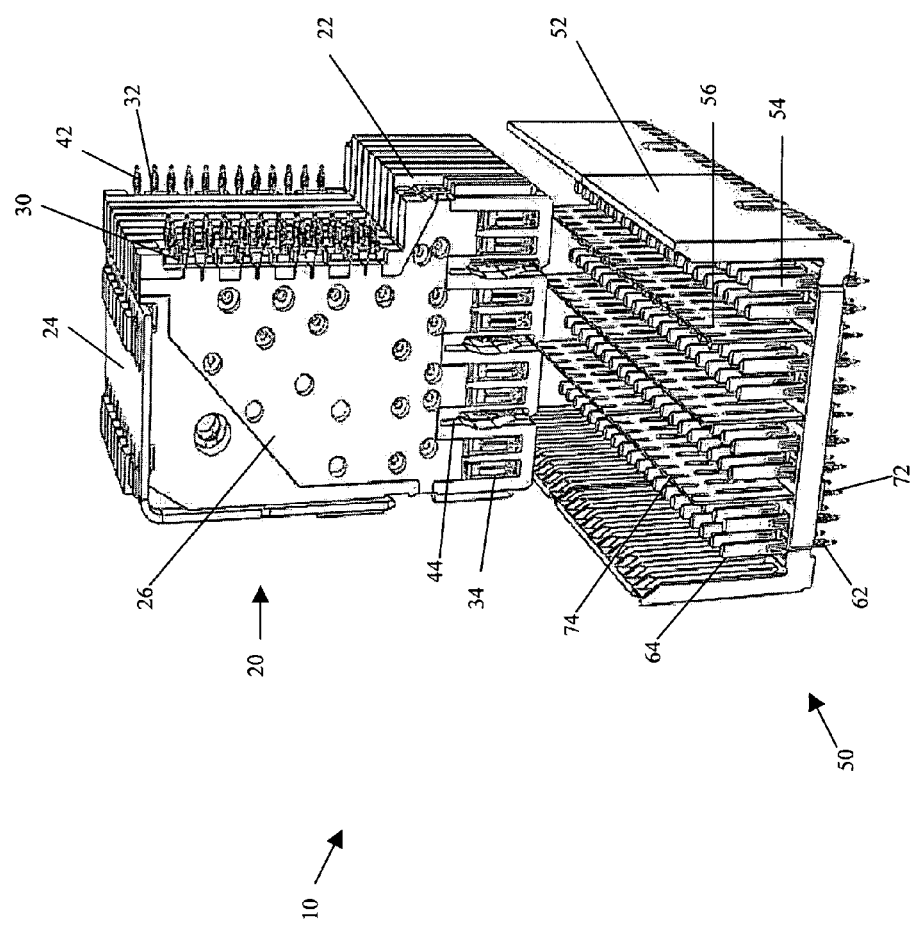
FIG. 1 shows a perspective view of a prior art electrical connector assembly illustrated as FIG. 1 in U.S. Pat. No. 6,409,543, where the electrical connector assembly includes a daughtercard connector and a backplane connector.

FIG. 1 shows a perspective view of a prior art electrical connector assembly 10 illustrated as FIG. 1 in U.S. Pat. No. 6,409,543. The '543 patent, which is directed to the GbX® connector, is assigned to the assignee of the present invention and is incorporated by reference herein. The electrical connector assembly 10 includes a daughtercard connector 20 that is connectable to a first printed circuit board (not shown) and a backplane connector 50 that is connectable to a second printed circuit board (not shown). The daughtercard connector 20 has a plurality of modules or wafers 22 which are preferably held together by a stiffener 24.

Each wafer 22 includes a plurality of signal conductors 30, a shield plate (not visible in FIG. 1), and a dielectric housing 26 that is formed around at least a portion of each of the plurality of signal conductors 30 and the shield plate. Each of the signal conductors 30 has a first contact end 32 connectable to the first printed circuit board and a second contact end 34 mateable to the backplane connector 50. Each shield plate has a first contact end 42 connectable to the first printed circuit board and a second contact end 44 mateable to the backplane connector 50.

The backplane connector 50 includes an insulative housing 52 and a plurality of signal conductors 54 held by the insulative housing 52. The plurality of signal conductors 30, 54 are arranged in an array of differential signal pairs. The backplane connector 50 also includes a plurality of shield plates 56 that are located between rows of differential signal pairs. Each of the signal conductors 54 has a first contact end 62 connectable to the second printed circuit board and a second contact end 64 mateable to the second contact end 34 of the corresponding signal conductor 30 of the daughtercard connector 20. Each shield plate 56 has a first contact end 72 connectable to the second printed circuit board and a second contact end 74 mateable to the second contact end 44 of the corresponding shield plate of the daughtercard connector 20.

As discussed in the Background Of The Invention section, the electrical connector assembly 10 of FIG. 1 does not have passive circuit elements that would provide desirable characteristics, such as DC flow minimization, desired filtering characteristics or data transmission loss reduction.

Figure 2:
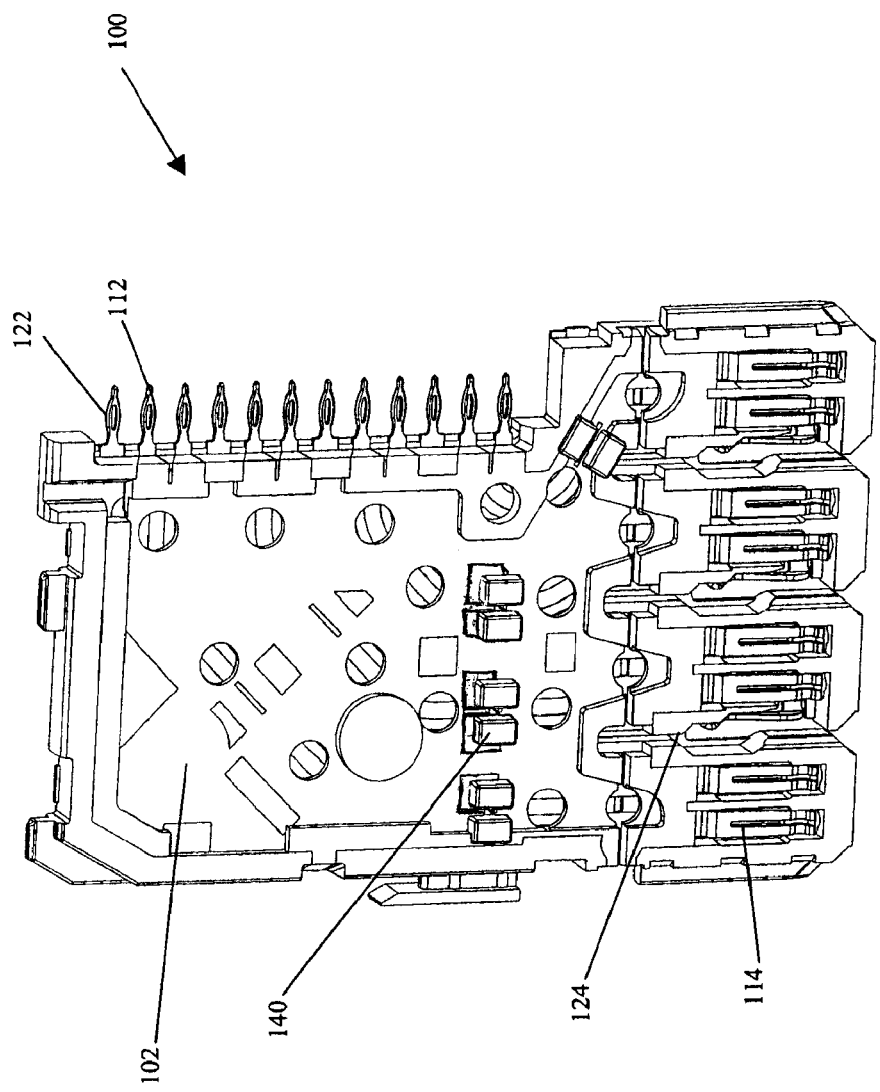
FIG. 2 shows a perspective view of a wafer of a daughtercard connector in accordance with the preferred embodiment of the present invention.
Figure 3:
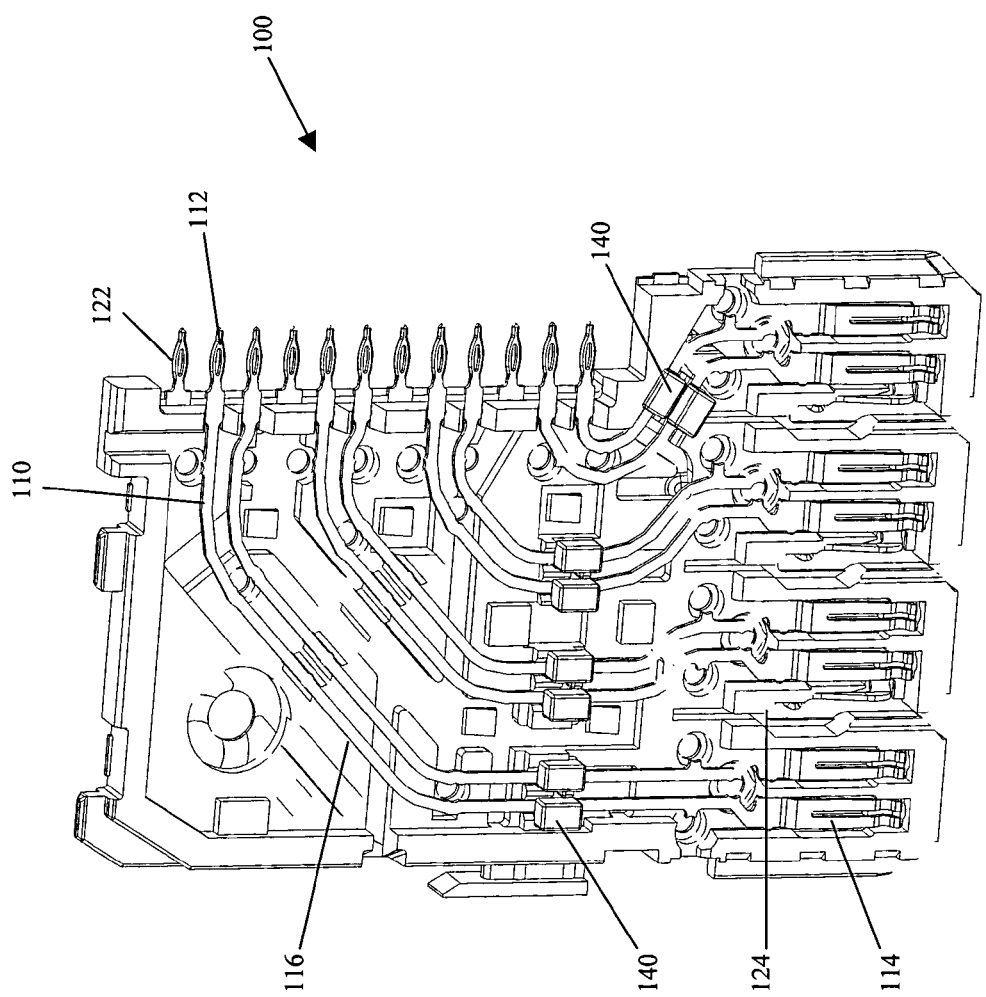
FIG. 3 shows a perspective view of the wafer of FIG. 2, with a portion of an insulative housing removed from the drawing to better illustrate attachment of passive circuit elements to signal conductors of the wafer.

Referring now to FIG. 2, there is shown a wafer 100 of a daughtercard connector (not shown) in accordance with the preferred embodiment of the present invention. The wafer 100 may be one of a plurality of such wafers that are held together by a stiffener, such as the stiffener 24 of FIG. 1. The wafer 100 includes a plurality of signal conductors 110 and an insulative housing 102. The signal conductors 110 are more clearly shown in FIG. 3, which illustrates the wafer 100 of FIG. 2 with a portion of the insulative housing 102 removed from the drawing. Note that the signal conductors 110 are arranged as differential signal pairs, with a first distance between signal conductors of a differential pair smaller than a second distance between signal conductors of adjacent differential pairs. However, it should be apparent to one of ordinary skill in the art reading this specification that the present invention and its concepts can be applied equally as well to single-ended signal connectors.

Each signal conductor 110 has a first contact end 112, a second contact end 114 and an intermediate portion 116 therebetween. The intermediate portion 116 of the signal conductor 110 is disposed within the insulative housing 102. Preferably, the wafer 100 also includes a ground conductor member or a shield plate having a first contact end 122 and a second contact end 124. The configuration of the shield plate may be similar to the shield plate of FIG. 1. The first contact ends 112, 122, which are illustrated as press-fit "eye of the needle" contact ends, are connectable to a first printed circuit board (not shown). The second contact ends 114, 124 are connectable to a mating connector (not shown), such as the backplane connector 50 of FIG. 1.

Attached to the intermediate portion 116 of each signal conductor 110 is a passive circuit element 140. Preferably, the passive circuit element 140 includes at least a capacitor or an inductor housed in an insulative package and is a commercially available off-the-shelf component. For example, if the passive circuit element 140 is desired to function as a direct current blocking circuit, then may be one of the ceramic or tantalum chip capacitors that are sold by KEMET Electronics Corporation of Greenville, S.C. can be utilized. The technical information for these ceramic or tantalum chip capacitors are available from KEMET (www.kemet.com) and are incorporated by reference herein. If the passive circuit element 140 is desired to function as a high frequency passive equalization circuit, then one of the resistor/inductor/capacitor packages that are sold by Maxim Integrated Products, Inc. of Sunnyvale, Calif. can be utilized. The technical information for these packages are available from Maxim (www.maxim-ic.com) and are incorporated by reference herein. It should be noted that while the preferred embodiment is directed to a two-piece (daughtercard connector and backplane connector), shielded, differential pair connector assembly, the concepts of the invention are applicable to a one-piece connector, an unshielded connector, a single-ended connector or any other type of electrical connector.

Figure 6:
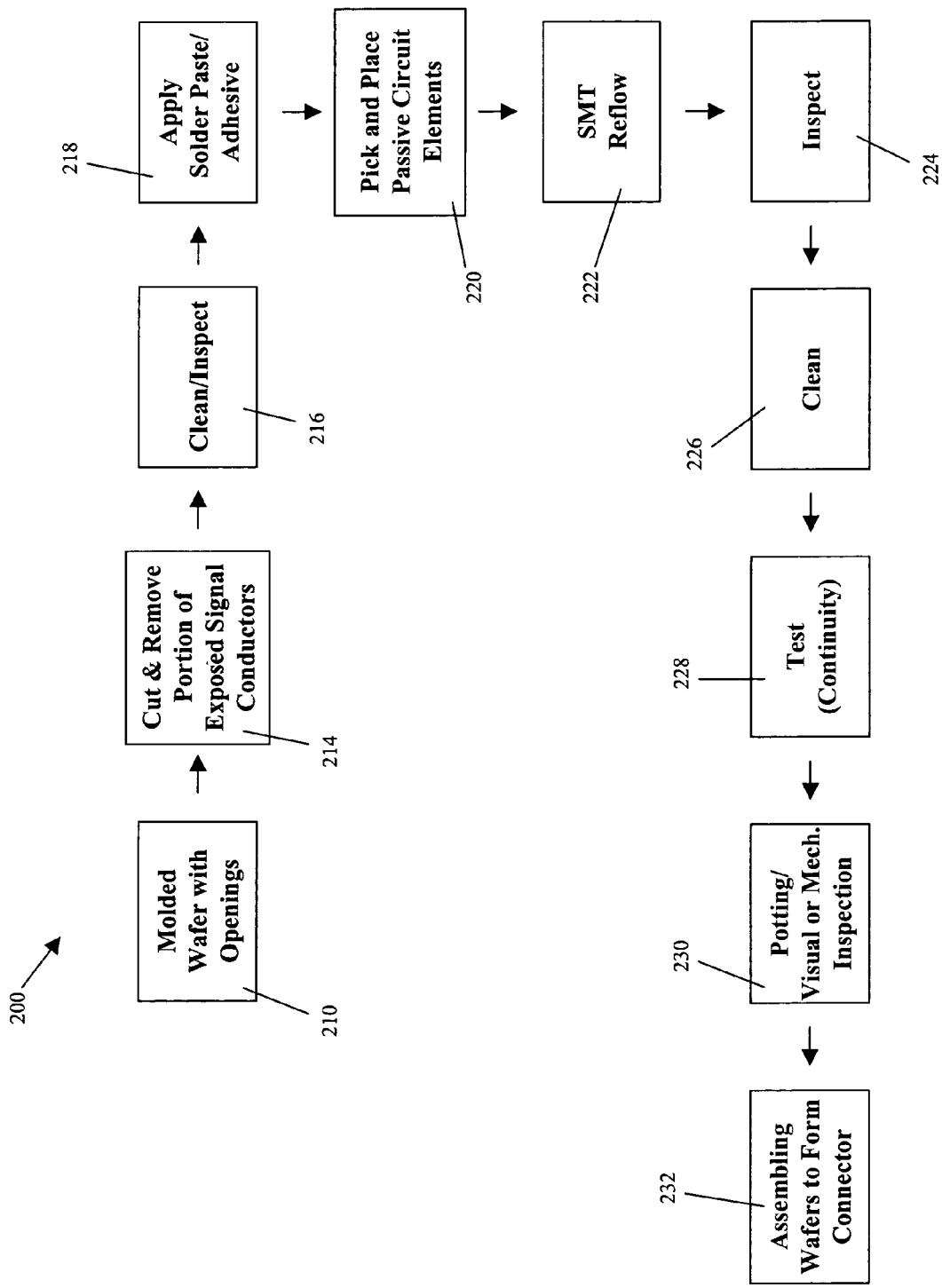
FIG. 6 shows a flowchart of a preferred manufacturing process for the connector in accordance with the present invention.

Referring now to FIG. 6, there is shown a flowchart 200 of a preferred manufacturing process for a connector in accordance with the present invention. This flowchart 200 illustrates the process steps for modifying and adapting an existing connector, such as the daughtercard connector 20 of FIG. 1, to provide the desirable passive circuit elements. It should be apparent to one of ordinary skill in the art that as the various process steps of the flowchart 200 are described, some of the steps need not be included in order to manufacture a connector in accordance with the present invention. Furthermore, the sequence of some of the steps may be varied.

Step 210 describes providing a wafer, such as a wafer 22 of FIG. 1, where during the molding of the insulative housing around the plurality of signal conductors, openings are defined through which an exposed area of each of the signal conductors is accessible. Preferably, the openings are provided adjacent the intermediate portions 116 of the signal conductors 110. Note that the plurality of signal conductors are preferably stamped from a lead frame, as is known in the art. Typically, the signal conductors 110 are made of a solder wettable material, such as beryllium-copper or the like, and intermediate portions 116 of the signal conductors 110 may be coated with nickel or other non-solder wetting material. In this case, the exposed area of the signal conductors is provided with solder wettable material, such as tin-lead coating.

Figure 4:
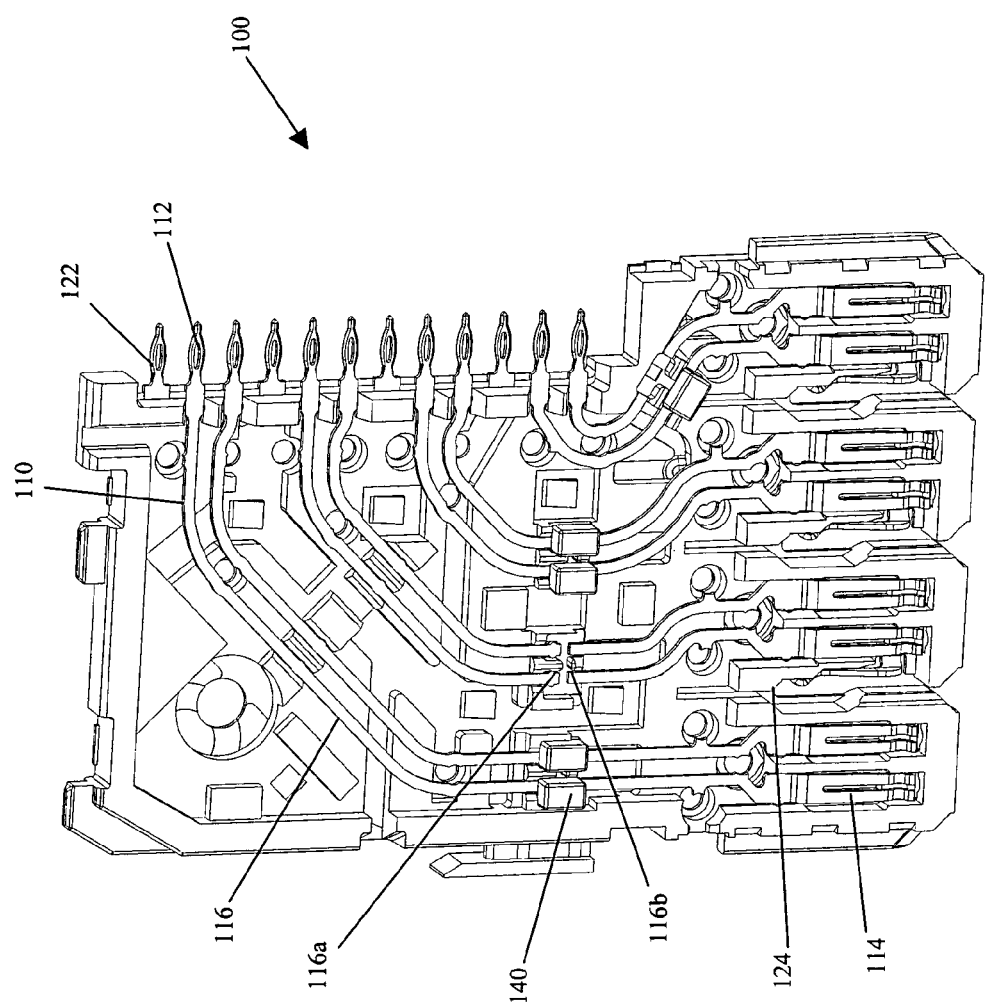
FIG. 4 shows a perspective view of the wafer of FIG. 3, with some of the passive circuit elements removed from the drawing to better illustrate portions of the signal conductors to which the passive circuit elements are attached.

Step 214 describes cutting and removing a portion of the exposed area of the signal conductors such that only a portion of the exposed area remains. FIG. 4, which is a perspective view of the wafer 100 of FIG. 3 with some of the passive circuit elements 140 removed from the drawing, shows the remaining portion 116a, 116b of the exposed area of the signal conductors 110. Step 216 describes cleaning and inspecting the signal conductors 110 after the cutting and removing step 214. This step can be performed manually or automatically, and can be bypassed if desired.

Step 218 describes applying solder paste or conductive adhesive to the remaining portion 116a, 116b of the exposed area of the signal conductors 110. Step 220 then describes picking and placing passive circuit elements 140 onto the remaining portions 116a, 116b of the exposed area of the signal conductors 110. Note that the openings in the insulative housing described in step 210 are sized to receive the passive circuit elements 140. And step 222 describes conventional SMT reflow to securely attach the passive circuit elements 140 to the remaining portions 116a, 116b of the exposed area of the signal conductors 110. While the preferred method of step 218 is to apply the solder paste or conductive adhesive to the remaining portion 116a, 116b of the exposed area of the signal conductors 110, it should be apparent to one of ordinary skill in the art that the solder paste/conductive adhesive may instead be applied to the passive circuit elements 140 or to both the remaining portion 116a, 116b of the exposed area of the signal conductors 110 and the passive circuit elements 140 as desired.

Steps 224 and 226 respectively describe inspecting and cleaning the attachment area around the passive circuit elements 140 and the remaining portions 116a, 116b of the exposed area of the signal conductors 110. Steps 228 and 230 respectively describe testing for electrical continuity across the attachment area and potting/visual or mechanical inspection as required. Finally, step 232 describes assembling a plurality of wafers 100 to form a connector in accordance with the preferred embodiment of the present invention.

While the flowchart 200 illustrates cutting and removing a portion of the exposed area of the signal conductors 110 (step 214) after the insulative housing has been molded around the plurality of signal conductors, it is certainly possible, and in some cases even preferable, to cut and remove the portion of the exposed area of the signal conductors before the insulative housing has been molded around the plurality of signal conductors. The molded insulative housing will define openings through which the remaining portion of the exposed area of the signal conductors will be accessible.

In an alternative manufacturing process (not shown) for a connector in accordance with the present invention, a passive circuit element (preferably a capacitive element) may be provided as follows: (i) providing a first lead frame which includes a plurality of first signal conductors, with each of the plurality of first signal conductors having a first contact end and an intermediate portion; (ii) providing a second lead frame which includes a plurality of second signal conductors, with each of the plurality of second signal conductors having a second contact end and an intermediate portion; (iii) positioning the plurality of first signal conductors and the plurality of second signal conductors adjacent one another such that for each first signal conductor there is a corresponding second signal conductor adjacent thereto; (iv) attaching at least a segment of the intermediate portion of each first signal conductor to at least a segment of the intermediate portion of the corresponding second signal conductor with a dielectric material provided therebetween so as to provide a capacitive element; and (v) providing an insulative housing around at least a portion of each of the plurality of first and second signal conductors. In this process, the attached intermediate portions of the first signal conductor and the second signal conductor serve as capacitive plates to provide the desired capacitive characteristics. Other applicable steps from FIG. 6 can then be utilized as needed.

Figure 5:
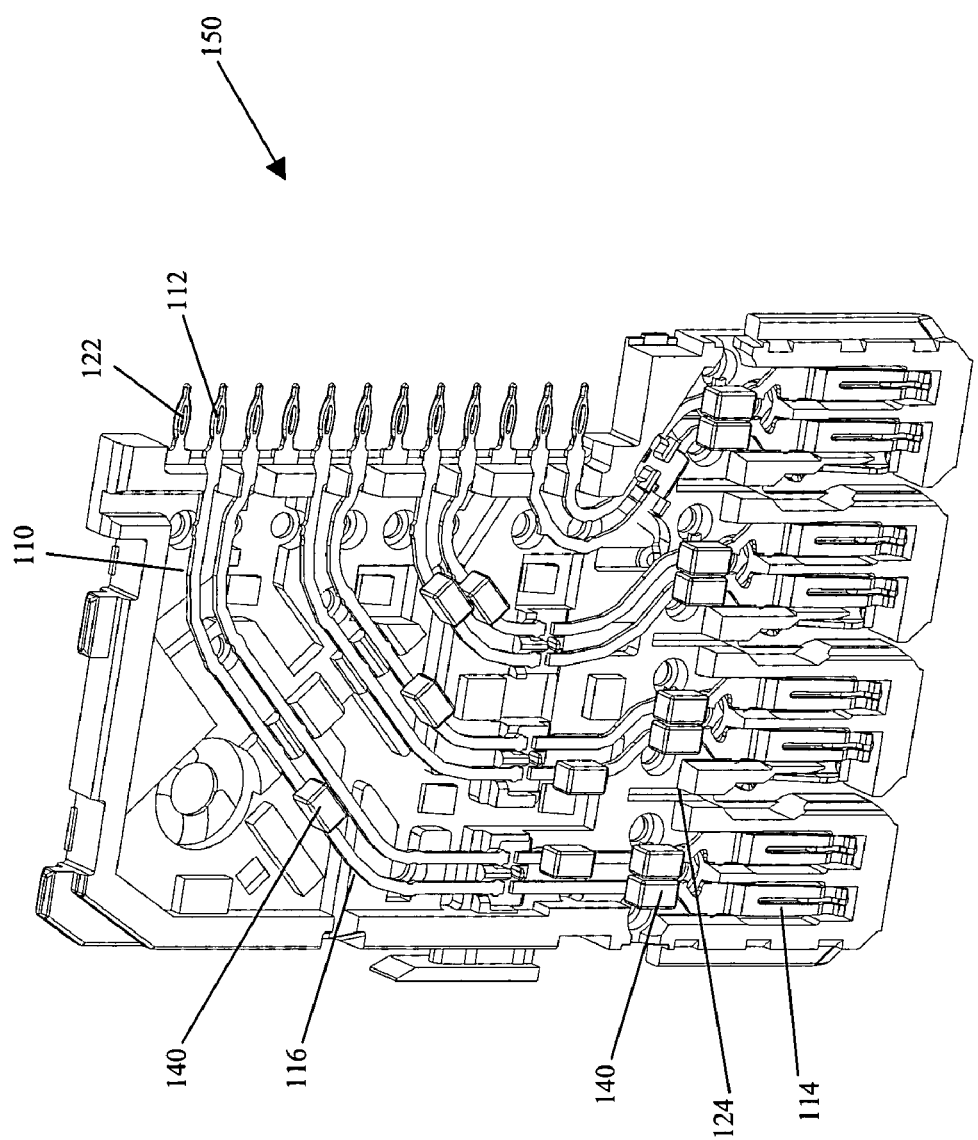
FIG. 5 shows a perspective view of a wafer of a daughtercard connector in accordance with another embodiment of the present invention.

Referring now to FIG. 5, there is shown a perspective view of a wafer 150 of a daughtercard connector (not shown) in accordance with another embodiment of the present invention. The wafer 150 may be one of a plurality of such wafers that are held together by a stiffener, such as the stiffener 24 of FIG. 1. The wafer 150 of FIG. 5 is similar to the wafer 100 of FIG. 2, with the substantive difference being the presence of additional passive circuit elements 140 along the intermediate portions 116 of the signal conductors 110. Note that in the wafer 150 illustrated in FIG. 5, all but two signal conductors that are shortest in length are provided with two passive circuit elements 140 each. In some simulations, it has been shown that having additional passive circuit elements 140 provides better desired qualities, such as high frequency passive equalization. It should be noted that the desirable number of passive circuit elements 140 is not limited to one or two per signal conductor, but rather depends on various other factors, including the structure and electrical characteristics of the connector.

Having described the preferred embodiment of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. An electrical connector that electrically connects a first printed circuit board and a second printed circuit board, the electrical connector comprising:
    an insulative housing;
    a plurality of signal conductors, with at least a portion of each of the plurality of signal conductors disposed within the insulative housing;
    each of the plurality of signal conductors including a first segment and a second segment that are spatially separated to form a gap therebetween; and
    a circuit element electrically connected to the first and second segments of each of the plurality of signal conductors to bridge the gap;
    wherein the insulative housing contains at least one opening exposing the gap between the first and second segments, and wherein the opening receives the circuit element.

2. The electrical connector of claim 1, wherein the plurality of signal conductors are disposed within the insulative housing as differential pairs of signal conductors, with a first distance between signal conductors of a differential pair smaller than a second distance between signal conductors of adjacent differential pairs.

3. The electrical connector of claim 1, wherein the circuit element is positioned in the opening.

4. The electrical connector of claim 1, wherein the circuit element bridges the gap.

5. The electrical connector of claim 4, wherein the passive circuit element is electrically connected to the first and second segments by at least one of soldering or conductive adhesive.

6. The electrical connector of claim 1, wherein the circuit element comprises a passive circuit element housed in an insulative package.

7. The electrical connector of claim 6, wherein the passive circuit element includes at least one of a capacitor, an inductor, and a resistor.

8. An electrical connector comprising:
a plurality of wafers, with each of the plurality of wafers including:
an insulative housing;
    a plurality of signal conductors, with at least a portion of each of the plurality of signal conductors disposed within the insulative housing;
    each of the plurality of signal conductors including a first segment and a second segment that are spatially separated to form a gap therebetween;
    a circuit element electrically connected to the first and second segments of each of the plurality of signal conductors to bridge the gap;
    a ground conductor member with at least a portion disposed within the insulative housing; and
    a stiffener that holds the plurality of wafers in parallel to one another;
    wherein the insulative housing contains at least one opening exposing the gap between the first and second segments, and wherein the opening receives the circuit element.

9. The electrical connector of claim 8, wherein for each of the plurality of wafers, the plurality of signal conductors are disposed within the insulative housing as differential pairs of signal conductors, with a first distance between signal conductors of a differential pair smaller than a second distance between signal conductors of adjacent differential pairs.

10. The electrical connector of claim 8, wherein the circuit element is positioned in the opening.

11. The electrical connector of claim 8, wherein the circuit element bridges the gap.

12. The electrical connector of claim 11, wherein the passive circuit element is electrically connected to the first and second segments by soldering or conductive adhesive.

13. The electrical connector of claim 8, wherein the circuit element comprises a passive circuit element housed in an insulative package.

14. The electrical connector of claim 13, wherein the passive circuit element includes at least one of a capacitor, an inductor, and a resistor.

15. An electrical connector configured to connect a first circuit board and a second circuit board, the connector comprising:
   at least one insulative housing;
   at least one signal conductor disposed at least in part in the insulative housing, the at least one signal conductor including a first segment and a second segment that are spatially separated to form a gap therebetween; and
   at least one circuit element connected to the first and second segments to bridge the gap;
   wherein the insulative housing contains at least one opening exposing the gap between the first and second segments, and wherein the opening receives the circuit element.

16. The electrical connector of claim 15, wherein a first end of the at least one signal conductor is configured to connect to the first printed circuit board.

17. The electrical connector of claim 15, wherein the circuit element includes at least one of a capacitor, an inductor, and a resistor.

18. The electrical connector of claim 15, wherein the circuit clement is positioned in the opening.

19. The electrical connector of claim 15, wherein the second segment of the at least one conductor is configured to be connected to a mating connector.

20. The electrical connector of claim 19, wherein the mating connector includes a backplane connector.

* * * * *